(12) United States Patent
Liang et al.

(10) Patent No.: US 11,940,338 B2
(45) Date of Patent: Mar. 26, 2024

(54) ELECTRIC-CARRIER POWER-SUPPLY DEVICE AND METHOD FOR DETECTING POTENTIAL POWER FAILURE

(71) Applicant: Wistron Corp., New Taipei (TW)

(72) Inventors: Chen Yi Liang, New Taipei (TW); Yung Chen Chang, New Taipei (TW)

(73) Assignee: WISTRON CORP., New Taipei (TW)

(*) Notice: Subject to any disclaimer, the term of this patent is extended or adjusted under 35 U.S.C. 154(b) by 99 days.

(21) Appl. No.: 17/822,208

(22) Filed: Aug. 25, 2022

(65) Prior Publication Data

US 2023/0400367 A1    Dec. 14, 2023

(51) Int. Cl.
*G01L 1/18* (2006.01)
*G01R 31/3835* (2019.01)
*B60L 50/60* (2019.01)

(52) U.S. Cl.
CPC ............ *G01L 1/18* (2013.01); *G01R 31/3835* (2019.01); *B60L 50/60* (2019.02)

(58) Field of Classification Search
CPC ...................................................... B60L 50/60
See application file for complete search history.

(56) References Cited

U.S. PATENT DOCUMENTS

| 11,674,490 B2* | 6/2023 | Clarke | H02J 7/0042 |
| | | | 123/179.1 |
| 2016/0161367 A1* | 6/2016 | Chu | G01M 15/02 |
| | | | 324/433 |

(Continued)

FOREIGN PATENT DOCUMENTS

| CN | 102623767 A | 8/2012 |
| CN | 105589010 A | 5/2016 |
| CN | 108631015 A | 10/2018 |

(Continued)

OTHER PUBLICATIONS

European Search Report dated Aug. 29, 2023, issued in application No. EP 22199509.5.

(Continued)

*Primary Examiner* — Jared Fureman
*Assistant Examiner* — Esayas G Yeshaw
(74) *Attorney, Agent, or Firm* — McClure, Qualey & Rodack, LLP

(57) ABSTRACT

An electric-carrier power-supply device for use in an electric carrier is provided. The electric-carrier power-supply device includes a piezoresistive sensor, a battery interface, and a power-management unit (PMU). The battery interface is connected to an on-board battery and receives power from the on-board battery. The PMU controls power to a motor of the electric carrier. A piezoresistive strain gage is disposed between a contact area between the battery interface and the on-board battery, and is used to detect a pressure value of the contact area. The piezoresistive sensor receives the pressure value detected by the piezoresistive strain gage, and converts the pressure value into a resistance value. The piezoresistive sensor determines whether the resistance value is within a safe resistance value range to generate a resistance-value-determination signal. The PMU determines whether to provide power to the motor is according to the resistance-value-determination signal.

20 Claims, 7 Drawing Sheets

(56) References Cited

U.S. PATENT DOCUMENTS

2021/0310427 A1* 10/2021 Jones ................ B60W 10/26
2022/0194236 A1*  6/2022 Whiting .............. B60L 53/55

FOREIGN PATENT DOCUMENTS

| CN | 211892913 U | 11/2020 |
| --- | --- | --- |
| JP | H09-306468 A | 11/1997 |
| JP | 2015-115313 A | 6/2015 |
| JP | 2022-021577 A | 2/2022 |

OTHER PUBLICATIONS

Japanese language office action dated May 30, 2023, issued in application No. JP 2022-172486.
English language translation of office action dated May 30, 2023.
Chinese language office action dated Dec. 14, 2022, issued in application No. TW 111120027.

* cited by examiner

ELECTRIC-CARRIER POWER-SUPPLY DEVICE AND METHOD FOR DETECTING POTENTIAL POWER FAILURE

CROSS REFERENCE TO RELATED APPLICATIONS

This Application claims priority of Taiwan Patent Application No. 111120027, filed on May 30, 2022, the entirety of which is incorporated by reference herein.

BACKGROUND OF THE DISCLOSURE

Field of the Disclosure

The present disclosure relates to power-supply devices, and, in particular, to an electric-carrier power-supply device and a method for detecting potential power failure.

Description of the Related Art

With the advancements being made in technology, electric carriers are becoming more and more popular. The on-board batteries used in today's electric carriers (e.g., electric vehicles, electric motorcycles, electric bicycles, electric wheelchairs, electric walkers, electric skateboards, etc.) may experience a sudden power failure due to a design failure. A sudden power failure happening in an electric carrier can easily cause an accident, potentially injuring the user. For example, in today's electric carriers, the battery interface on the side of the system to which the on-board battery is connected may be a spring-contact type or a plug type. However, when the electric carrier is running, vibration may cause the on-board battery to have poor contact after long-term use, which may lead to power failure in the electric carrier.

BRIEF SUMMARY OF THE DISCLOSURE

In view of the above, an electric-carrier power-supply device and a method for detecting potential power failure are provided in the disclosure to solve the aforementioned problem.

In an exemplary embodiment, an electric-carrier power-supply device for use in an electric carrier is provided. The electric-carrier power-supply device includes a piezoresistive sensor, a battery interface, and a power-management unit (PMU). The battery interface is connected to an on-board battery and receives power from the on-board battery. The PMU controls power to a motor of the electric carrier. A piezoresistive strain gage is disposed between a contact area between the battery interface and the on-board battery, and is used to detect a pressure value of the contact area. The piezoresistive sensor receives the pressure value detected by the piezoresistive strain gage, and converts the pressure value into a resistance value. A resistance-value-determination signal is generated by the piezoresistive sensor. The power-management unit provides power to the motor in response to the resistance-value-determination signal which is determined by the power-management unit as within a safe resistance value range.

In some embodiments, when the pressure value detected by the piezoresistive strain gage is higher, the resistance value converted from the pressure value by the piezoresistive sensor is lower. When the pressure value detected by the piezoresistive strain gage is lower, the resistance value converted from the pressure value by the piezoresistive sensor is higher.

In some embodiments, the power-management unit receives first battery information reported by a battery-management unit (BMU) of the on-board battery through the battery interface, and receives second battery information reported by the battery-management unit of the on-board battery via an antenna device through a wireless link.

In some embodiments, the first battery information comprises a first voltage, a first battery level, and a first temperature of the on-board battery, and the second battery information comprises a second voltage, a second battery level, and a second temperature of the on-board battery.

In some embodiments, the power-management unit further determines a difference between the first battery information and the second battery information. In response to the power-management unit determining that the difference between the first battery information and the second battery information is greater than a predetermined threshold, the power-management unit issues a warning message and slowly reduces the rotational speed of the motor until the motor stops running.

In some embodiments, the electric carrier further includes a displacement-driving device, disposed between the power-management unit and the battery interface, and the displacement-driving device comprises a driving motor and a guide rod member. Activation and deactivation of the driving motor are controlled by the resistance-value-determination signal. The safe resistance value range comprises a predetermined bottom resistance limit and a predetermined upper resistance limit. In response to the resistance value being lower than the predetermined bottom resistance limit, the resistance-value-determination generated by the piezoresistive sensor is in a first state. In response to the resistance value being between the predetermined bottom resistance limit and the predetermined upper resistance limit, the resistance-value-determination generated by the piezoresistive sensor is in a second state. In response to the resistance value being greater than the predetermined upper resistance limit, the resistance-value-determination generated by the piezoresistive sensor is in a third state.

In some embodiments, in response to the resistance-value-determination signal being in the first state, the driving motor is activated to reversely rotate to adjust displacement of the guide rod member to keep the battery interface away from the on-board battery; wherein in response to the resistance-value-determination signal being in the second state, the driving motor is turned off; wherein in response to the resistance-value-determination signal being in the third state, the driving motor is activated to rotate to adjust displacement of the guide rod member to keep the battery interface close to the on-board battery.

In some embodiments, the guide rod member comprises a lead screw, a slider, and a spring group, wherein when the driving motor is activated to rotate, the driving motor drives the lead screw to rotate, and the slider is displaced in a direction of the on-board battery to compress the spring group.

In some embodiments, after the driving motor starts to rotate to adjust the displacement of the guide rod member, generate the resistance-value-determination signal is generated by the piezoresistive sensor.

In another exemplary embodiment, a method for detecting potential power failure for use in an electric carrier is provided. The electric carrier comprises a piezoresistive sensor, a battery interface, and a power-management unit (PMU), wherein the battery interface is connected to an on-board battery and receives power from the on-board battery. The method includes the following steps: utilizing a piezoresistive strain gage disposed in the connection between the battery interface and the on-board battery to detect a pressure value of the connection; utilizing the piezoresistive sensor to receive the pressure value detected by the piezoresistive strain gage; utilizing the piezoresistive sensor to generate a resistance-value-determination signal; and utilizing the power-management unit to provide power to the motor in response to the resistance-value-determination signal being determined by the power-management unit as within a safe resistance value range.

In some embodiments, when the pressure value detected by the piezoresistive strain gage is higher, the resistance value converted from the pressure value by the piezoresistive sensor is lower. When the pressure value detected by the piezoresistive strain gage is lower, the resistance value converted from the pressure value by the piezoresistive sensor is higher.

In some embodiments, the power-management unit receives first battery information reported by a battery-management unit (BMU) of the on-board battery through the battery interface, and receives second battery information reported by the battery-management unit of the on-board battery via an antenna device through a wireless link.

In some embodiments, the first battery information comprises a first voltage, a first battery level, and a first temperature of the on-board battery, and the second battery information comprises a second voltage, a second battery level, and a second temperature of the on-board battery.

In some embodiments, the method further includes the following steps: utilizing the power-management unit to determine whether a difference between the first battery information and the second battery information is greater than a predetermined threshold; and in response to the power-management unit determining that the difference between the first battery information and the second battery information is greater than the predetermined threshold, utilizing the power-management unit to issue a warning message and to slowly reduce the rotational speed of the motor until the motor stops running.

In some embodiments, the electric carrier further includes a displacement-driving device, disposed between the power-management unit and the battery interface, and the displacement-driving device comprises a driving motor and a guide rod member. Activation and deactivation of the driving motor are controlled by the resistance-value-determination signal. The safe resistance value range comprises a predetermined bottom resistance limit and a predetermined upper resistance limit. In response to the resistance value being lower than the predetermined bottom resistance limit, the resistance-value-determination generated by the piezoresistive sensor is in a first state. In response to the resistance value being between the predetermined bottom resistance limit and the predetermined upper resistance limit, the resistance-value-determination generated by the piezoresistive sensor is in a second state. In response to the resistance value being greater than the predetermined upper resistance limit, the resistance-value-determination generated by the piezoresistive sensor is in a third state.

In some embodiments, the method further includes the following steps: in response to the resistance-value-determination signal being in the first state, activating the driving motor to reversely rotate to adjust displacement of the guide rod member to keep the battery interface away from the on-board battery; in response to the resistance-value-determination signal being in the second state, turning off the driving motor; and in response to the resistance-value-determination signal being in the third state, activating the driving motor to rotate to adjust displacement of the guide rod member to keep the battery interface close to the on-board battery.

In some embodiments, the guide rod member comprises a lead screw, a slider, and a spring group. When the driving motor is activated to rotate, the driving motor drives the lead screw to rotate, so that the slider is displaced in a direction of the on-board battery to compress the spring group.

In some embodiments, when the driving motor rotates reversely, the driving motor drives the lead screw to reversely rotate, and the battery interface is away from the on-board battery.

In some embodiments, the method further includes the following step: after the driving motor is activated to rotate to adjust the displacement of the guide rod member, utilizing the piezoresistive sensor to re-determine whether the resistance value is within the safe resistance value range to generate the resistance-value-determination signal.

In some embodiments, the power-management unit is a central processing unit, a general-purpose processor, or a microcontroller.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

The following description is made for the purpose of illustrating the general principles of the disclosure and should not be taken in a limiting sense. The scope of the disclosure is determined by reference to the appended claims.

It should be understood that the words "comprising", "including" and the like used in this specification are used to indicate the existence of specific technical features, values, method steps, operation processes, elements and/or components, but do not It is not excluded that more technical features, values, method steps, work processes, elements, components, or any combination of the above can be added.

Figure 1:
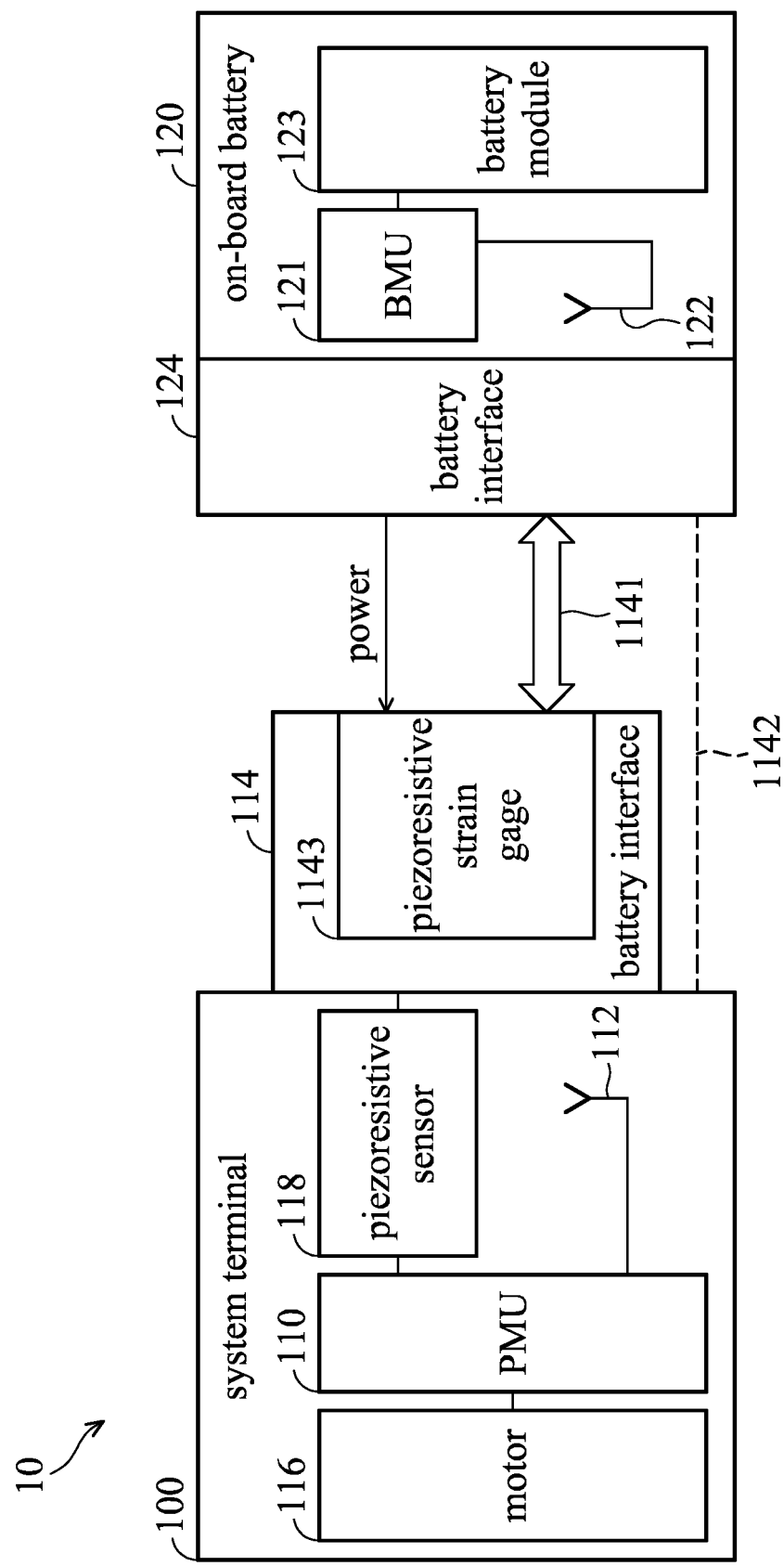
FIG. 1 is a block diagram of an electric carrier in accordance with an embodiment of the disclosure.

FIG. 1 is a block diagram of an electric carrier in accordance with an embodiment of the disclosure. The electric carrier 10 may be, for example, various types of electric carriers, such as electric vehicles, electric motorcycles, electric bicycles, electric wheelchair, electric walkers, electric skateboards, etc., but the disclosure is not limited thereto. As shown in FIG. 1, the electric carrier 10 may include a system terminal and an on-board battery 120. In an embodiment, the system terminal 100 of the electric carrier 10 may roughly include a power management unit (PMU) 110, an antenna device 112, a battery interface 114, a motor 116 (may also include other related driving components), and a piezoresistive sensor 118, where the PMU 110, the antenna device 112, and the battery interface 116 as a whole can be regarded as an electric-carrier power-supply device. The PMU 110 is used for controlling the operation of the electric carrier 10, such as power management, executing user command, sending warning messages, etc., but the disclosure is not limited thereto.

In some embodiments, the PMU 10, for example, may be implemented by a central processing unit (CPU), a general-purpose processor, or a microcontroller, but the disclosure is not limited thereto.

The antenna device 112 may receive first battery information emitted by the battery management unit (BMU) 121 of the on-board battery 120 through the antenna 122 using a near-field communication (NFC) protocol (e.g., the wireless link 1142), wherein the first battery information may include the battery voltage, battery level, and battery temperature of the on-board battery 120. The battery interface 114 may adopt a spring contact type or a plug type design, but the disclosure is not limited thereto.

The on-board battery 120 may include the battery management unit (BMU) 121, the antenna device 122, a battery module 123, and a battery interface 124. The battery module 122 may include one or more battery cells for providing power. The BMU 121 may detect the battery voltage, battery level, and battery temperature of the battery module 123, and report the aforementioned battery information to the system terminal 100 through two paths.

For example, the on-board battery 120 may provide power to the system terminal 100 through the physically connected battery interface 114, and the battery interface 114 can read second battery information reported by the BMU 121 of the on-board battery 120 through the bus 1141, and transmit the second battery information to the PMU 110, where the second battery information may also include the battery voltage, battery level, and battery temperature of the on-board battery 120.

In an embodiment, a piezoresistive strain gage 1143 is arranged in the contact area between the battery interface 114 and the on-board battery 120, and the resistance value of the piezoresistive strain gage 1143 may change with the pressure. For example, when the pressure on the contact area is higher, the resistance value of the piezoresistive strain gage 1143 is lower, which means that the contact area between the battery interface 114 and the on-board battery 120 is in a normal-contact condition. When the pressure on the contract area is lower, the resistance value of piezoresistive strain gage 1143 is higher, which means that the contact area between the battery interface 114 and the vehicle battery 120 is loose. The piezoresistive sensor 118 can also be referred to as a piezoresistive pressure sensor, which can detect the resistance value of the piezoresistive strain gage 1143 on the battery interface 114, and report the detection result (or the resistance value) to the PMU 110. The piezoresistive sensor 118 can be disposed on the battery interface 114 or in the system terminal 100.

Therefore, the PMU 110 may determine whether the contact area between the battery interface 114 and the on-board battery 120 is loose or excessively close according to the detection result (or the resistance value). For example, the piezoresistive sensor 118 can set a safe resistance value range, which a predetermined bottom resistance limit and a predetermined upper resistance limit of the resistance value. When the resistance is lower than the predetermined bottom resistance limit, the resistance-value-determination signal reported by the piezoresistive sensor 118 to the PMU 110 may be in a first state, which means that the contact area between the battery interface 114 and the on-board battery 120 is in excessively close contact. When the resistance value is within the safe resistance value range (i.e., between the predetermined bottom resistance limit and the predetermined upper resistance limit), the resistance-value-determination signal reported by the piezoresistive sensor 118 to the PMU 110 may be in a second state, which means that the contact area between the battery interface 114 and the on-board battery 120 (i.e., shrapnel-to-shrapnel) is in a normal-contact condition. When the resistance value is greater than the predetermined upper resistance limit, the resistance-value-determination signal reported by the piezoresistive sensor 118 to the PMU 110 may be in a third state, which means that the contact area between the battery interface 114 and the on-board battery is in a loose condition (i.e., first abnormal condition).

In some embodiments, the connection between the on-board battery 120 and the battery interface 114 may be loose, so that the PMU 110 cannot receive the second battery information, or an error occurs in the second battery information. In addition, since the connection between the on-board battery 120 and the battery interface 114 may be loose, the resistance value detected by the piezoresistive sensor 118 will also be greater than or equal to the predetermined resistance value. When the PMU 110 compares the first battery information and the second battery information, the PMU 110 may find that the first battery information and the second battery information do not match, and determines that the on-board battery 120 is in a second abnormal condition.

No matter whether the PMU 110 determines that the first abnormal condition or the second abnormal condition occurs, the PMU 110 enters a warning state to issue a warning to notify the user of the occurrence of a battery abnormality. If the PMU 110 determines that the difference between the first battery information and the second battery information is greater than a predetermined threshold, the PMU 110 enters a forced stop state to slowly reduce the rotation speed of the motor 116, thereby allowing the user to stop driving the electric carrier 10, where in the aforementioned warning may be, for example, a sound, a flash, or a text message or a warning image displayed on the display of the system terminal 100, but the disclosure is not limited thereto.

Figure 2:
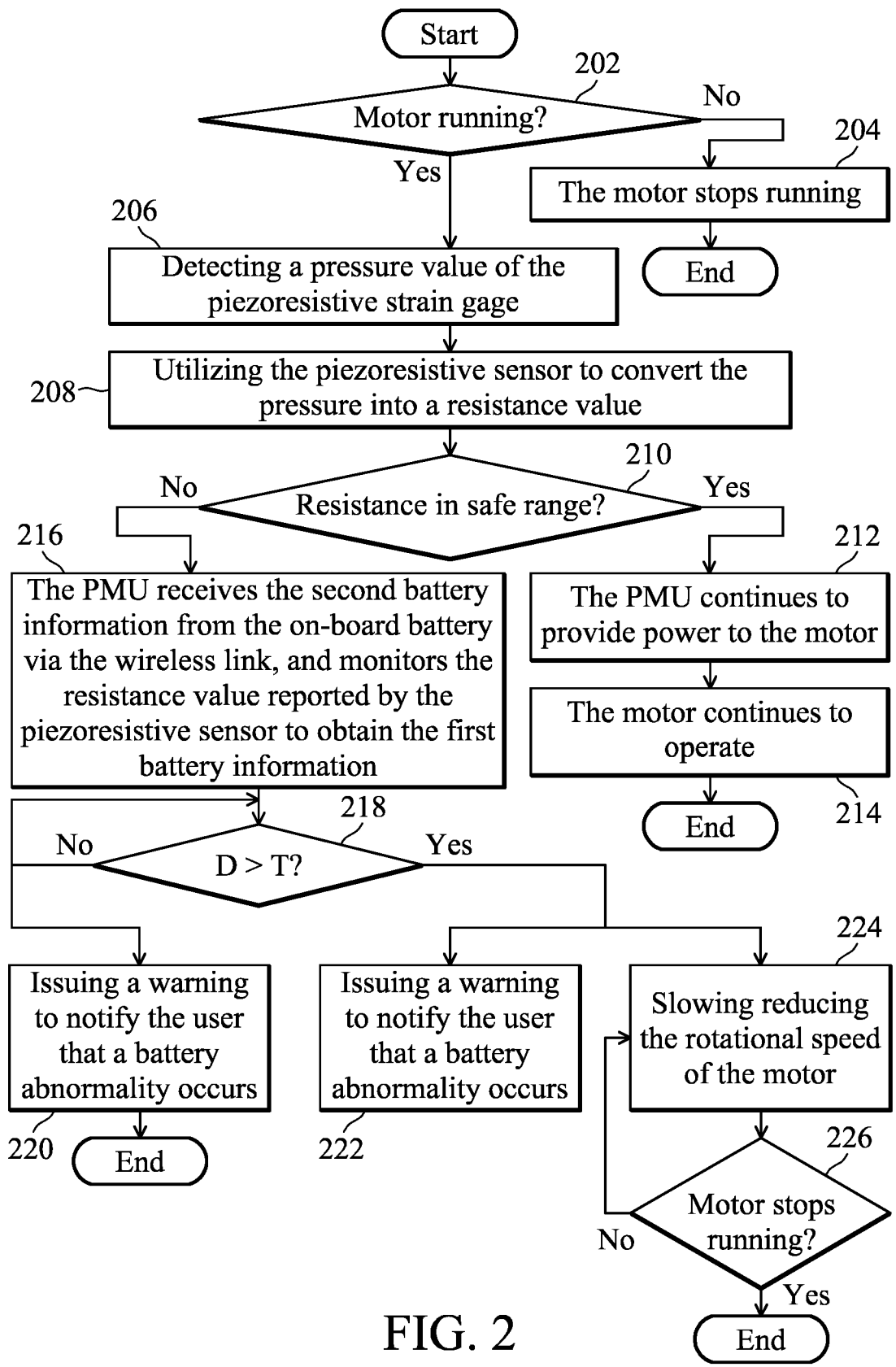
FIG. 2 is a flow chart of a method for detecting potential power failure in accordance with the embodiment of FIG. 1.

FIG. 2 is a flow chart of a method for detecting potential power failure in accordance with the embodiment of FIG. 1. Please refer to FIG. 1 and FIG. 2.

In block 202, the PMU 110 determines whether the motor 116 is running. When the PMU 110 determines that the motor 116 is running, block 206 is performed. When the PMU 110 determines that the motor 116 is not running, block 204 is performed. For example, in order to detect the potential power failure of the electric carrier 10, it is usually required when the electric carrier 10 is running. If the electric carrier 10 is not started, there is no need to detect potential power failure.

In block 204, the motor 116 is stopped and the flow ends.

In block 206, the pressure value of the piezoresistive strain gage 1143 is detected.

In block 208, the resistance value corresponding to the pressure value is converted using the piezoresistive sensor 118. For example, the piezoresistive strain gage 1143 is disposed in the contact area between the battery interface and the on-board battery 120, and the resistance value of the piezoresistive strain gage 1143 changes with the pressure. For example, when the pressure on the connection area is higher, the resistance value of the piezoresistive strain gage 1143 is lower, which means that the contact area between the battery interface 114 and the on-board battery 120 is in a normal-contact condition. When the pressure in the connection area is lower, the resistance value of the piezoresistive strain gage 143 is higher, which means that the contact area between the battery interface 114 and the on-board battery is loose. The piezoresistive sensor 118 can detect the resistance value of the piezoresistive strain gage 1143 on the battery interface 114, and report the resistance value to the PMU 110, or report the determination result of the resistance value to the PMU 110.

In block 210, the piezoresistive sensor 118 determines whether the resistance value is within a safe range. If the piezoresistive sensor 118 determines that the resistance value is within the safe range, block 212 is performed. If the piezoresistive sensor 118 determines that the resistance value is not within the safe range, block 216 is performed. For example, the piezoresistive sensor 118 can set a safe resistance value range, which a predetermined bottom resistance limit and a predetermined upper resistance limit of the resistance value. When the resistance is lower than the predetermined bottom resistance limit, the resistance-value-determination signal reported by the piezoresistive sensor 118 to the PMU 110 may be in a first state, which means that the contact area between the battery interface 114 and the on-board battery 120 is in excessively close contact. When the resistance value is within the safe resistance value range (i.e., between the predetermined bottom resistance limit and the predetermined upper resistance limit), the resistance-value-determination signal reported by the piezoresistive sensor 118 to the PMU 110 may be in a second state, which means that the contact area between the battery interface 114 and the on-board battery 120 (i.e., shrapnel-to-shrapnel) is in a normal-contact condition. When the resistance value is greater than the predetermined upper resistance limit, the resistance-value-determination signal reported by the piezoresistive sensor 118 to the PMU 110 may be in a third state, which means that the contact area between the battery interface 114 and the on-board battery is in a loose condition (i.e., first abnormal condition).

In block 212, the PMU 110 continues to provide power to the motor 116, and in block 214, the motor 116 continues to operate.

In block 216, the PMU 110 receives the second battery information from the on-board battery via the wireless link, and monitors the resistance value reported by the piezoresistive sensor 118 to obtain the first battery information (or obtain the first battery information reported by the BMU 121 from the bus 1141). For example, the PMU 110 may obtain the first battery information and the second battery information from the physical connection terminal (e.g., the battery interface 114) and the wireless receiving terminal (e.g., the antenna device 112), respectively.

The connection between the on-board battery 120 and the battery interface 114 may be loose, so that the PMU 110 cannot receive the first battery information, or the first battery information is erroneous. In addition, since the connection between the on-board battery 120 and the battery interface 114 may be loose, the resistance value detected by the piezoresistive sensor 118 will also be greater than or equal to the predetermined resistance value. When the PMU 110 compares the first battery information and the second battery information, the PMU 110 may find that the first battery information and the second battery information do not match, or the difference between the first battery information and the second battery information is greater than a predetermined threshold (e.g., differences of any of the voltages, battery levels, and temperatures is greater than the corresponding predetermined threshold), and determines that the on-board battery 120 is in the second abnormal condition.

In block 218, the PMU 110 determines whether the difference D between the first battery information (I1) and the second battery information (I2) is greater than the predetermined threshold T. When the PMU 110 determines that the difference between the first battery information and the second battery information is greater than the predetermined threshold T, the flow proceeds to blocks 222 and 224. When the PMU 110 determines that the difference between the first battery information and the second battery information is not greater than the predetermined threshold, the flow goes to block 220 and can go back to block 218 to continue the determination.

For example, when the determination result in block 210 of FIG. 2 is "No", it indicates that the resistance value of the piezoresistive strain gage 1143 detected by the piezoresistive sensor 118 is greater than or equal to the predetermined resistance value, that is, the contact area between the battery interface 114 and the on-board battery 120 is loose. Accordingly, no matter whether the determination result in block 218 is, the PMU 110 will issue a warning to notify the user that a battery abnormality occurs (blocks 220 and 222).

In block 224, the PMU 110 slowly reduces the rotational speed of the motor 116, and at block 226, it is determined whether the motor 116 has stopped running. If it is determined that the motor 116 is still running, the flow returns to block 224 to continue to slowly reduce the rotational speed of the motor 116. If it is determined that the motor 116 has stopped running, the flow ends.

Figure 3:
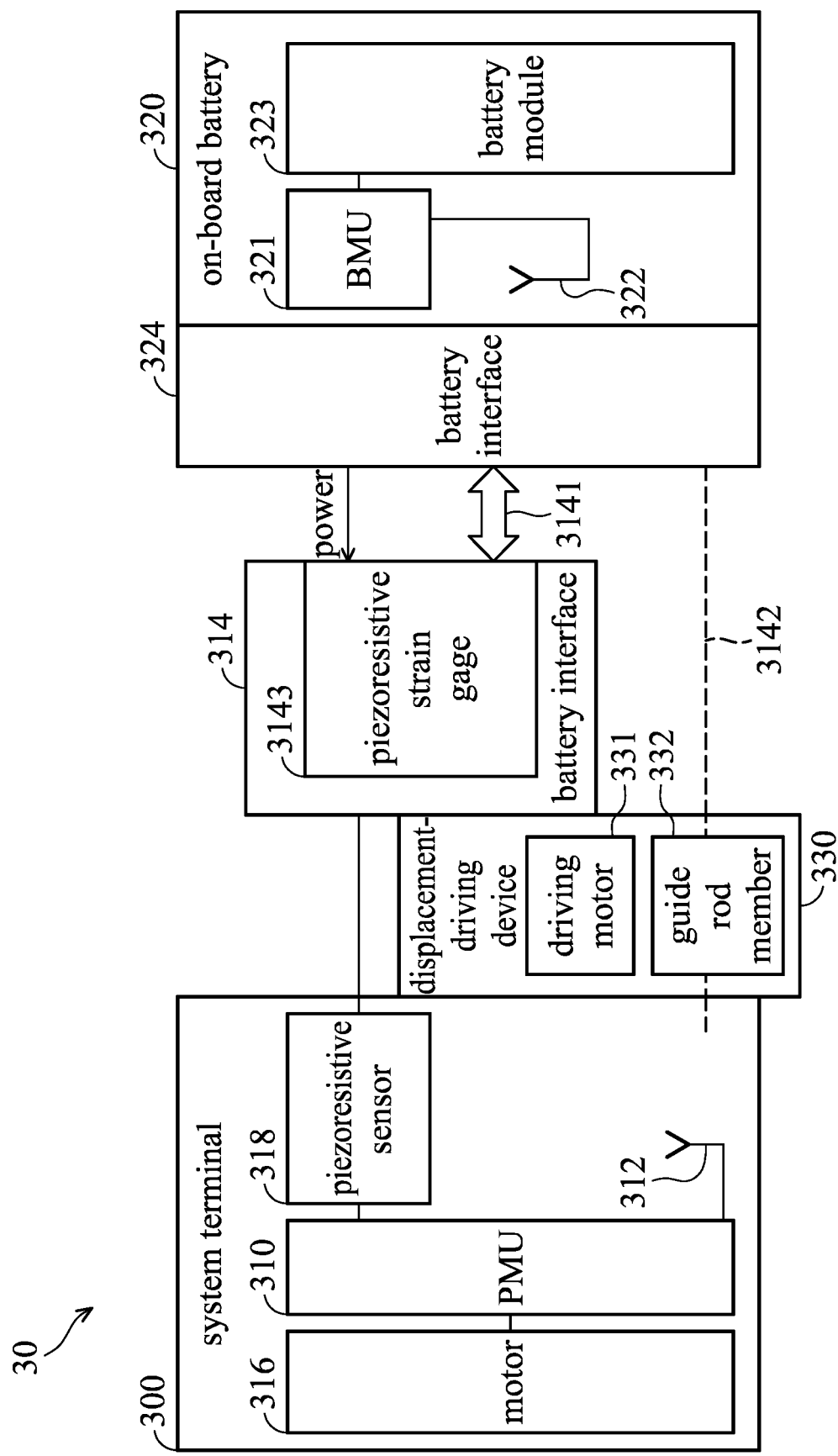
FIG. 3 is a block diagram of an electric carrier in accordance with another embodiment of the disclosure.

FIG. 3 is a block diagram of an electric carrier in accordance with another embodiment of the disclosure. Please refer to FIG. 1 and FIG. 3.

The electric carrier 30 in FIG. 3 is similar to the electric carrier 10 in FIG. 1, and the difference is that the electric carrier 30 in FIG. 3 additionally includes a displacement-driving device 330, which can control the displacement of the battery interface 314 to be closer to the on-board battery 320 to avoid loosening of the connection between the battery interface 314 and the on-board battery 320. For example, the piezoresistive sensor 318 can set a safe resistance value range, which a predetermined bottom resistance limit and a predetermined upper resistance limit of the resistance value. When the resistance is lower than the predetermined bottom resistance limit, the resistance-value-determination signal reported by the piezoresistive sensor 318 to the PMU 310 may be in a first state, which means that the contact area between the battery interface 114 and the on-board battery 320 is in excessively close contact. When the resistance value is within the safe resistance value range (i.e., between the predetermined bottom resistance limit and the predetermined upper resistance limit), the resistance-value-determination signal reported by the piezoresistive sensor 318 to the PMU 310 may be in a second state, which means that the contact area between the battery interface 314 and the on-board battery 320 (i.e., shrapnel-to-shrapnel or plug-to-plug) is in a normal-contact condition. When the resistance value is greater than the predetermined upper resistance limit, the resistance-value-determination signal reported by the piezoresistive sensor 318 to the PMU 310 may be in a third state, which means that the contact area between the battery interface 314 and the on-board battery is in a loose condition (i.e., first abnormal condition).

The piezoresistive sensor 318 can further transmit the resistance-value-determination signal (or resistance value) to the driving motor 331, so as to control the rotation of the driving motor 331 to adjust the displacement of the guide rod member 332. For example, when the resistance-value-determination signal reported by the piezoresistive sensor 318 is in the first state (or when the controller of the driving motor 331 determines that the resistance value is lower than the predetermined bottom resistance limit), it indicates that the contact area between the battery interface 314 and the on-board battery 320 is excessively close contact, and it may cause excessive pressure to damage the elastic component (e.g., spring group 3327, the shrapnel of the battery interface 314, etc.). At this time, the driving motor 331 will start reverse rotation to drive the guide rod member 332 to move backward, so as to keep the battery interface 314 away from the on-board battery 320. When the resistance-value-determination signal reported by the piezoresistive sensor 318 is in the second state (or when the controller of the driving motor 331 determines that the resistance value is equal to the predetermined resistance value), it means that the contact area between the battery interface 314 and the on-board battery 320 is in a normal-contact condition, so the driving motor 331 stops working at this time. When the resistance-value-determination signal reported by the piezoresistive sensor 318 is in the third state (or when the controller of the driving motor 331 determines that the resistance value is greater than the predetermined upper resistance limit), it means that the contact area between the battery interface 314 and the on-board battery 320 is in a loose condition, so at this time, the driving motor 331 will start to rotate (e.g., forward rotation) to drive the guide rod member 332 to move forward, so that the shrapnel of the battery interface 314 (not shown in FIG. 3) can be closer to the shrapnel of the battery interface 324 (not shown in FIG. 3). Therefore, when the resistance value reported by the piezoresistive sensor 318 changes from a higher resistance value to a normal resistance value, it can be considered that the aforementioned loose condition has been resolved.

Figure 4A:
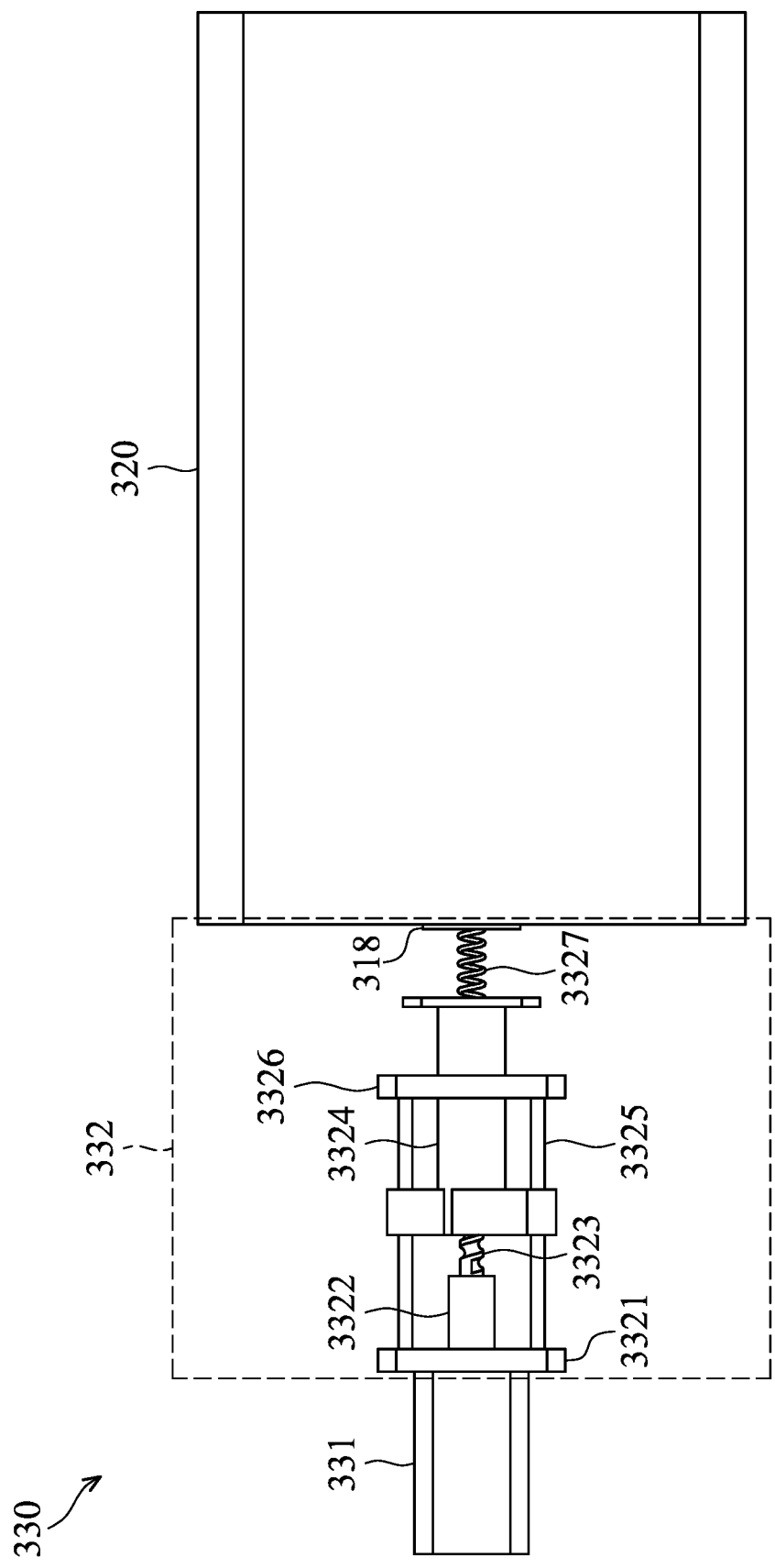
FIG. 4A is a diagram of the guide rod member in accordance with the embodiment of FIG. 3.
Figure 4B:
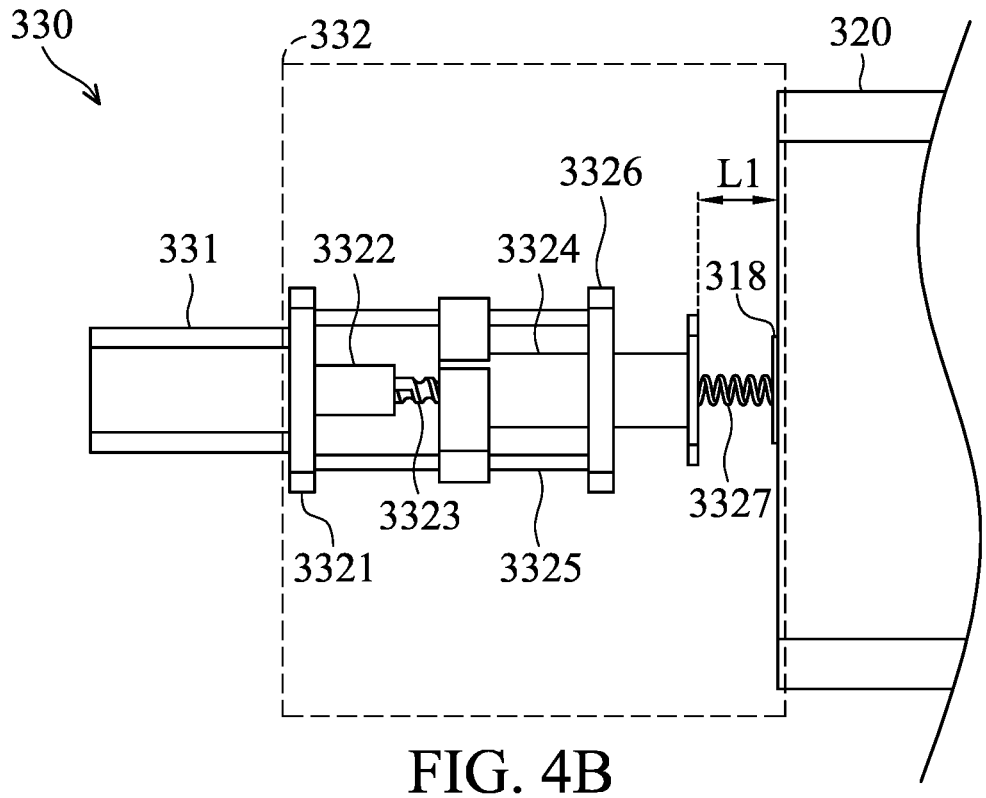
FIGS. 4B to 4D are diagrams of the use states of the guide rod member in accordance with the embodiment of FIG. 3.
Figure 4C:
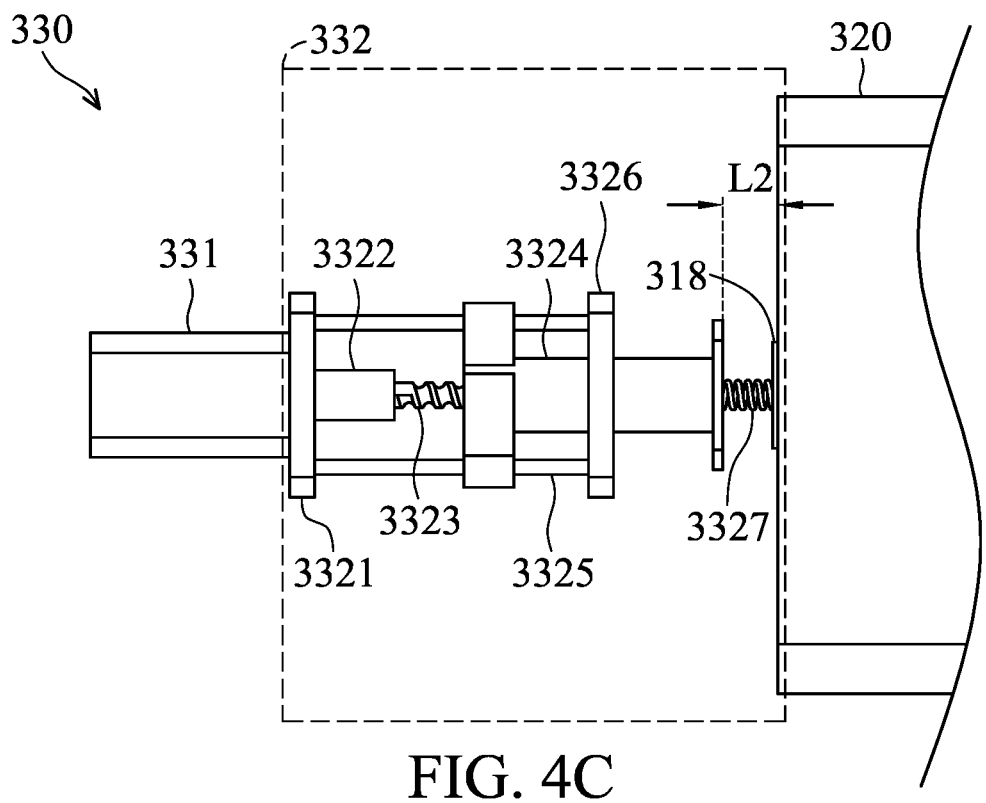
Figure 4D:
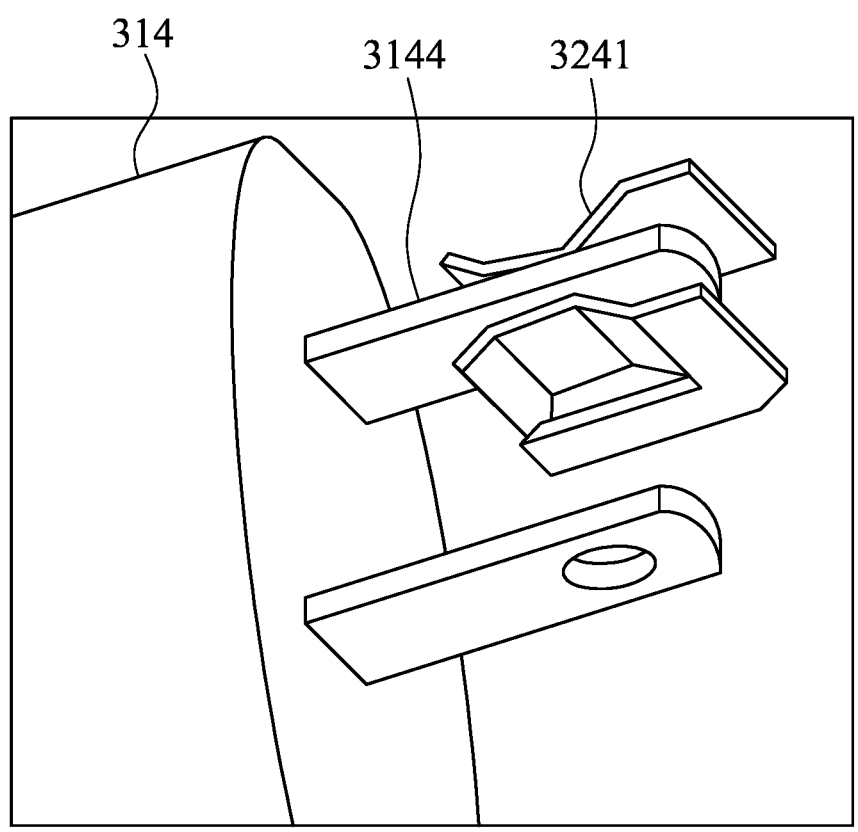

FIG. 4A is a diagram of the guide rod member in accordance with the embodiment of FIG. 3. FIGS. 4B to 4D are diagrams of the use states of the guide rod member in accordance with the embodiment of FIG. 3. Please refer to FIG. 3 and FIGS. 4A-4D.

In an embodiment, as shown in FIG. 4A, the displacement-driving device 330 may include a driving motor 331 and a guide rod member 332. The guide rod member 332 may include a motor-fixing frame 3321, a coupling 3322, a lead screw 3323, a slider 3324, a guide rod 3325, a guide-rod fixing frame 3326, and a spring group 3327. When the on-board battery 320 is inserted into the battery interface 320, the driving motor 331 is not activated, and the spring group 3327 has a first length L1 at this time, as shown in FIG. 4B. In some embodiments, the coupling 3322 can be omitted, that is, the driving motor 331 can directly drive the lead screw 3323 to rotate or reversely rotate.

Specifically, when the driving motor 331 starts to rotate, the driving motor 331 can drive the lead screw 3323 to rotate (or drive the lead screw 3323 to rotate through the coupling 3322) to cause the slider 3324 to move to the right (i.e., the direction toward the on-board battery 320, which is right side in FIG. 4A), which can compresses the spring group 3327, as shown in FIG. 4C. At this time, the spring group 3327 has a second length L2, wherein the second length L2 is shorter than the first length L1. Therefore, the contact area between the piezoresistive sensor 318 and the on-board battery 320 can be tighter, so as to avoid the looseness of the on-board battery 320.

Specifically, when the driving motor 331 starts to rotate to drive the guide rod member 332 to move forward, the pressure applied to the spring group 3327 and the piezoresistive strain gage 3143 will also increase accordingly. Thus, the resistance value of the piezoresistive strain gage 3143 also decreases, and the resistance value of the piezoresistive strain gage 3143 detected by the piezoresistive sensor 318 can return to the normal resistance value range.

In addition, when the driving motor 331 is activated for reverse rotation, the driving motor 331 can drive the lead screw 3323 to reversely rotate (or drive the lead screw 3323 to reversely rotate through the coupling 3322) to cause the slider 3324 to move left, so that the battery interface 314 moves away from the on-board battery 320.

In some embodiments, the battery interface 314 may be of a plug-type design to connect to the shrapnel of the battery interface 324 of the on-board battery 320. As shown in FIG. 4D, when the driving motor 331 starts to rotate to drive the guide rod member 332 to move forward, the plug 3144 of the battery interface 314 will push the shrapnel 3241 in the socket (e.g., the battery interface 324), so that the shrapnel 3241 can regain the normal contact force. Accordingly, the resistance value between the plug 3144 of the battery interface 314 and the shrapnel 3241 of the battery interface 324 can be reduced to a normal resistance value range.

Figure 5:
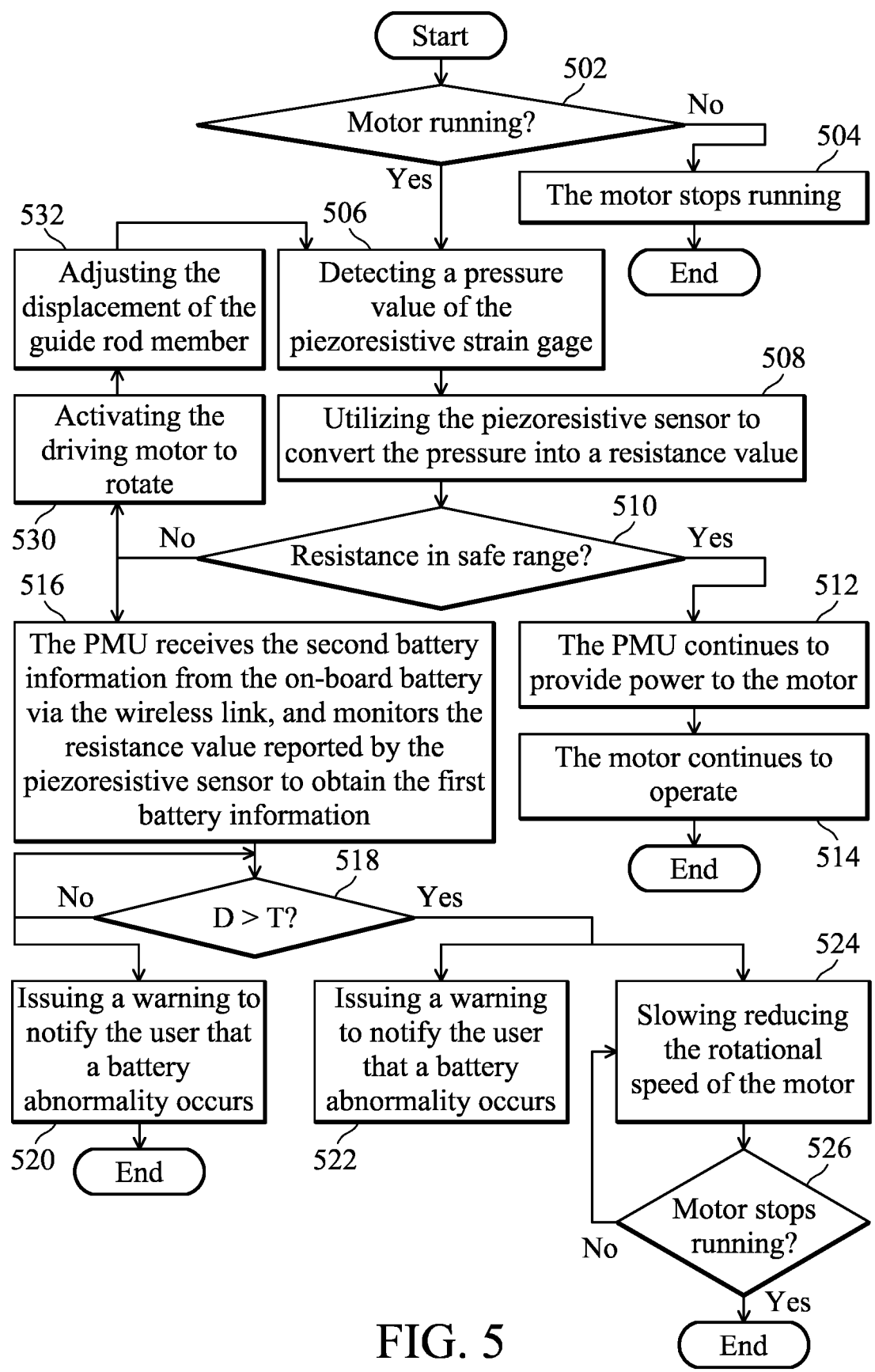
FIG. 5 is a flow chart of a method for detection potential power failure in accordance with the embodiment of FIG. 3.

FIG. 5 is a flow chart of a method for detection potential power failure in accordance with the embodiment of FIG. 3. Please refer to FIG. 3, FIG. 4, and FIG. 5.

Blocks 502-526 in the flow of FIG. 5 are similar to blocks 302-326 in the flow of FIG. 3, except that blocks 530 and 532 are further included in FIG. 5. For example, the piezoresistive sensor 318 can set a safe resistance value range, which a predetermined bottom resistance limit and a predetermined upper resistance limit of the resistance value. When the resistance is lower than the predetermined bottom resistance limit, the resistance-value-determination signal reported by the piezoresistive sensor 318 to the PMU 310 may be in a first state, which means that the contact area between the battery interface 114 and the on-board battery 320 is in excessively close contact. When the resistance value is within the safe resistance value range (i.e., between the predetermined bottom resistance limit and the predetermined upper resistance limit), the resistance-value-determination signal reported by the piezoresistive sensor 318 to the PMU 310 may be in a second state, which means that the contact area between the battery interface 314 and the on-board battery 320 (i.e., shrapnel-to-shrapnel or plug-to-plug) is in a normal-contact condition. When the resistance value is greater than the predetermined upper resistance limit, the resistance-value-determination signal reported by the piezoresistive sensor 318 to the PMU 310 may be in a third state, which means that the contact area between the battery interface 314 and the on-board battery is in a loose condition (i.e., first abnormal condition).

Accordingly, when the resistance-value-determination signal in block 510 is in the first state or the third state, in addition to performing block 516, blocks 530 and 532 are also simultaneously performed in the flow of FIG. 5. For example, in block 530, the driving motor 331 is activated to rotate or reversely rotate, and in block 532, the displacement of the guide rod member 332 is adjusted, so that the battery interface 314 can be closer or away from the on-board battery 320.

For example, when the resistance-value-determination signal reported by the piezoresistive sensor 318 is in the first state, it may cause excessive pressure to damage the elastic component (e.g., spring group 3327, the shrapnel of the battery interface 314, etc.). At this time, the driving motor 331 will start reverse rotation to drive the guide rod member 332 to move backward, so as to keep the battery interface 314 away from the on-board battery 320. When the resistance-value-determination signal reported by the piezoresistive sensor 318 is in the second state, it means that the contact area between the battery interface 314 and the on-board battery 320 is in a normal-contact condition, so the driving motor 331 stops working at this time. When the resistance-value-determination signal reported by the piezoresistive sensor 318 is in the third state, the resistance-value-determination signal may activate the driving motor 331 to start rotating, and the driving motor 331 can drive the lead screw 3323 to rotate, causing the slider 3324 to move to the right, thereby compressing the spring group 3327, so that the battery interface 314 can be moved closer to the on-board battery 320. Therefore, when block 532 is completed (no matter whether the battery interface 314 is moved closer to or away from the on-board battery 320), the flow of FIG. 5 will return to block 506 to re-detect the pressure value of the piezoresistive strain gage 3143.

In view of the above, an electric-carrier power-supply device and a method for detecting potential power failure are provided in the disclosure, which can use a piezoresistive sensor to convert the pressure, which is detected by a resistive strain gage disposed between the battery interface of the system terminal and the on-board battery, into a corresponding resistance value, and determine whether the contact area between the battery interface and the on-board battery is loose according to the resistance-value-determination result. When it is determined that the contact area is loose, the PMU can further issue a warning message to notify the user and slowly reduce the motor speed of the electric carrier, so as to prevent the electric carrier from sudden power failure due to loosening of the on-board battery while driving. In addition, in the electric-carrier power-supply device and the method for detecting potential power failure, a displacement-driving device can be disposed between the PMU and the battery interface, and it includes a driving motor and a guide rod member. The displacement-driving device can activate the driving motor to rotate according to the resistance-value-determination signal, so that the battery interface can move closer to the on-board battery to prevent the connection between the battery interface and the on-board battery from loosening. Thus, the probability of sudden power failure of the on-board battery of the electric carrier can be reduced, thereby improving the safety of the electric carrier. In addition, the displacement-driving device can also activate the driving motor to reversely rotate to control the displacement of the battery interface, so that the battery interface can be moved away from the on-board battery to avoid excessive tight contact between the battery interface and the on-board battery, thus preventing the elastic components of the battery interface from being damaged.

The terms such as "first", "second", and "third" are used in the claims to modify the elements in the claims, and are not used to indicate that there is a priority order, prior relationship, or is a component before another component, or the time sequence when performing method steps, only used to distinguish components with the same name.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electric-carrier power-supply device, for use in an electric carrier, the electric-carrier power-supply device comprising:
   a piezoresistive sensor;
   a battery interface, connected to an on-board battery and receiving power from the on-board battery; and
   a power-management unit (PMU), controlling power to a motor of the electric carrier,
   wherein a piezoresistive strain gage is disposed between a contact area between the battery interface and the on-board battery, and detects a pressure value of the contact area;
   wherein the piezoresistive sensor receives the pressure value detected by the piezoresistive strain gage, and converts the pressure value into a resistance value;
   wherein a resistance-value-determination signal is generated by the piezoresistive sensor;
   wherein the power-management unit provides power to the motor in response to the resistance-value-determination signal which is determined by the power-management unit as within a safe resistance value range.

2. The electric-carrier power-supply device as claimed in claim 1, wherein when the pressure value detected by the piezoresistive strain gage is higher, the resistance value converted from the pressure value by the piezoresistive sensor is lower,
   wherein when the pressure value detected by the piezoresistive strain gage is lower, the resistance value converted from the pressure value by the piezoresistive sensor is higher.

3. The electric-carrier power-supply device as claimed in claim 1, wherein the power-management unit receives first battery information reported by a battery-management unit (BMU) of the on-board battery through the battery interface, and receives second battery information reported by the battery-management unit of the on-board battery via an antenna device through a wireless link.

4. The electric-carrier power-supply device as claimed in claim 3, wherein the first battery information comprises a first voltage, a first battery level, and a first temperature of the on-board battery, and the second battery information comprises a second voltage, a second battery level, and a second temperature of the on-board battery.

5. The electric-carrier power-supply device as claimed in claim 4, wherein the power-management unit further determines a difference between the first battery information and the second battery information,
   wherein in response to the power-management unit determining that the difference between the first battery information and the second battery information is greater than a predetermined threshold, the power-management unit issues a warning message and slowly reduces the rotational speed of the motor until the motor stops running.

6. The electric-carrier power-supply device as claimed in claim 1, further comprising: a displacement-driving device, disposed between the power-management unit and the battery interface, and the displacement-driving device comprises a driving motor and a guide rod member;

wherein activation and deactivation of the driving motor are controlled by the resistance-value-determination signal;

wherein the safe resistance value range comprises a predetermined bottom resistance limit and a predetermined upper resistance limit;

wherein in response to the resistance value being lower than the predetermined bottom resistance limit, the resistance-value-determination generated by the piezoresistive sensor is in a first state;

wherein in response to the resistance value being between the predetermined bottom resistance limit and the predetermined upper resistance limit, the resistance-value-determination generated by the piezoresistive sensor is in a second state;

wherein in response to the resistance value being greater than the predetermined upper resistance limit, the resistance-value-determination generated by the piezoresistive sensor is in a third state.

7. The electric-carrier power-supply device as claimed in claim 6, wherein in response to the resistance-value-determination signal being in the first state, the driving motor is activated to reversely rotate to adjust displacement of the guide rod member to keep the battery interface away from the on-board battery;

wherein in response to the resistance-value-determination signal being in the second state, the driving motor is turned off;

wherein in response to the resistance-value-determination signal being in the third state, the driving motor is activated to rotate to adjust displacement of the guide rod member to keep the battery interface being close to the on-board battery.

8. The electric-carrier power-supply device as claimed in claim 6, wherein the guide rod member comprises a lead screw, a slider, and a spring group, wherein when the driving motor is activated to rotate, the driving motor drives the lead screw to rotate, and the slider is displaced in a direction of the on-board battery to compress the spring group.

9. The electric-carrier power-supply device as claimed in claim 6, wherein after the driving motor starts to rotate to adjust the displacement of the guide rod member, the resistance-value-determination signal is generated by the piezoresistive sensor.

10. A method for detecting potential power failure, for use in an electric carrier, wherein the electric carrier comprises a piezoresistive sensor, a battery interface, and a power-management unit (PMU), wherein the battery interface is connected to an on-board battery and receives power from the on-board battery, the method comprising:

utilizing a piezoresistive strain gage disposed in the contact area between the battery interface and the on-board battery to detect a pressure value of the contact area;

utilizing the piezoresistive sensor to receive the pressure value detected by the piezoresistive strain gage, and to convert the pressure value into a resistance value;

utilizing the piezoresistive sensor to generate a resistance-value-determination signal; and utilizing the power-management unit to provide power to the motor in response to the resistance-value-determination signal being determined by the power-management unit as within a safe resistance value range.

11. The method as claimed in claim 10, wherein when the pressure value detected by the piezoresistive strain gage is higher, the resistance value converted from the pressure value by the piezoresistive sensor is lower, wherein when the pressure value detected by the piezoresistive strain gage is lower, the resistance value converted from the pressure value by the piezoresistive sensor is higher.

12. The method as claimed in claim 10, further comprising:

utilizing the power-management unit to receive a first battery information reported by a battery-management unit (BMU) of the on-board battery through the battery interface, and to receive a second battery information reported by the battery-management unit of the on-board battery via an antenna device through a wireless link.

13. The method as claimed in claim 12, wherein the first battery information comprises a first voltage, a first battery level, and a first temperature of the on-board battery, and the second battery information comprises a second voltage, a second battery level, and a second temperature of the on-board battery.

14. The method as claimed in claim 13, further comprising:

utilizing the power-management unit to determine a difference between the first battery information and the second battery information; and in response to the power-management unit determining that the difference between the first battery information and the second battery information is greater than a predetermined threshold, utilizing the power-management unit to issue a warning message and to slowly reduce the rotational speed of the motor until the motor stops running.

15. The method as claimed in claim 10, wherein the electric carrier further comprises a displacement-driving device, disposed between the power-management unit and the battery interface, and the displacement-driving device comprises a driving motor and a guide rod member;

wherein activation and deactivation of the driving motor are controlled by the resistance-value-determination signal;

wherein the safe resistance value range comprises a predetermined bottom resistance limit and a predetermined upper resistance limit;

wherein in response to the resistance value is bottom than the predetermined lower resistance limit, the resistance-value-determination generated by the piezoresistive sensor is in a first state;

wherein in response to the resistance value is between the predetermined bottom resistance limit and the predetermined upper resistance limit, the resistance-value-determination generated by the piezoresistive sensor is in a second state;

wherein in response to the resistance value is greater than the predetermined upper resistance limit, the resistance-value-determination generated by the piezoresistive sensor is in a third state.

16. The method as claimed in claim 15, further comprising:

in response to the resistance-value-determination signal being in the first state, activating the driving motor to reversely rotate to adjust displacement of the guide rod member to keep the battery interface away from the on-board battery;

in response to the resistance-value-determination signal being in the second state, turning off the driving motor; and in response to the resistance-value-determination signal being in the third state, activating the driving motor to rotate to adjust displacement of the guide rod member to keep the battery interface close to the on-board battery.

17. The method as claimed in claim 15, wherein the guide rod member comprises a lead screw, a slider, and a spring group, wherein when the driving motor starts to rotate, the driving motor drives the lead screw to rotate, and the slider is displaced in a direction of the on-board battery to compress the spring group.

18. The method as claimed in claim 17, wherein when the driving motor rotates reversely, the driving motor drives the lead screw to reversely rotate, and the battery interface is away from the on-board battery.

19. The method as claimed in claim 15, further comprising:

after the driving motor is activated to rotate to adjust the displacement of the guide rod member to keep the battery interface close to the on-board battery, a resistance-value-determination signal is generated by the piezoresistive sensor.

20. The method as claimed in claim 10, wherein the power-management unit is a central processing unit, a general-purpose processor, or a microcontroller.

* * * * *